United States Patent
Rost et al.

(10) Patent No.: US 6,803,295 B2
(45) Date of Patent: Oct. 12, 2004

(54) VERSATILE SYSTEM FOR LIMITING MOBILE CHARGE INGRESS IN SOI SEMICONDUCTOR STRUCTURES

(75) Inventors: Timothy A. Rost, Plano, TX (US); Deems Randy Hollingsworth, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/174,367

(22) Filed: Jun. 18, 2002

(65) Prior Publication Data

US 2003/0122193 A1 Jul. 3, 2003

Related U.S. Application Data

(60) Provisional application No. 60/344,462, filed on Dec. 28, 2001.

(51) Int. Cl.[7] .............................................. H01L 21/301
(52) U.S. Cl. ....................................................... 438/462
(58) Field of Search .................. 438/310, 311, 438/402, 407, 462, 473, 347, 620; 257/347, 620

(56) References Cited

U.S. PATENT DOCUMENTS

| | | | | |
|---|---|---|---|---|
| 5,314,843 A | * | 5/1994 | Yu et al. ...................... | 438/692 |
| 6,091,086 A | * | 7/2000 | Zommer ...................... | 257/121 |
| 6,492,684 B2 | * | 12/2002 | Bolam et al. ................ | 257/349 |
| 6,593,637 B1 | * | 7/2003 | Ibok ............................ | 257/499 |
| 2001/0042862 A1 | * | 11/2001 | Epke ............................ | 257/54 |
| 2002/0140030 A1 | * | 10/2002 | Mandelman et al. ....... | 257/347 |

\* cited by examiner

*Primary Examiner*—Carl Whitehead, Jr.
*Assistant Examiner*—Jennifer M. Dolan
(74) *Attorney, Agent, or Firm*—Wade James Brady, III; Frederick J. Telecky, Jr.

(57) ABSTRACT

Disclosed are apparatus and method for limiting mobile charge (314) ingress within a silicon-on-insulator (SOI) substrate (300). A mask (308) is applied to the substrate to form an aperture (210) over a desired portion of the substrate near its outer edge. A buffer material (214), selected to impede mobile charge ingress, is implanted (310) through the aperture into the insulator layer (304) of the substrate to form a buffer structure (312).

10 Claims, 5 Drawing Sheets

*(Prior Art)*

VERSATILE SYSTEM FOR LIMITING MOBILE CHARGE INGRESS IN SOI SEMICONDUCTOR STRUCTURES

This application claims priority from Provisional Application Ser. No.: 60/344,462, filed on Dec. 28, 2001.

FIELD OF THE INVENTION

The present invention relates in general to the fabrication and operation of semiconductor devices and, more particularly, to apparatus and methods for limiting the diffusive ingress of mobile charges into silicon on insulator (SOI) semiconductor structures during fabrication and operation of a semiconductor device.

BACKGROUND OF THE INVENTION

The continual demand for enhanced integrated circuit performance has resulted in, among other things, a dramatic reduction of semiconductor device geometries, and continual efforts to optimize the performance of every substructure within a semiconductor device. A number of improvements and innovations in fabrication processes, material composition, and layout of the active circuit levels of semiconductor devices have resulted in very high-density circuit designs. Increasingly dense circuit design has not only improved a number of performance characteristics, it has also magnified the importance of semiconductor material properties and behaviors.

In the past, most semiconductor devices were fabricated directly on a bulk silicon substrate. Recently, however, semiconductor manufacturers have started to fabricate semiconductor devices on substrates having varied compositions. One such variety of substrate that is gaining in acceptance and popularity is silicon on insulator (SOI). The insulator configuration of SOI substrates offers semiconductor device designers a number of performance improvements over plain silicon substrates, such as improved leakage currents and improved latch-up characteristics. SOI substrates typically comprise a relatively thin silicon layer disposed atop an insulator layer, which is typically an oxide and which is, in turn, disposed atop a relatively thick bulk silicon layer. SOI substrates are manufactured in a variety of ways. One such method comprises sandwiching an oxide between two bulk silicon substrates, and then grinding the upper bulk silicon substrate down until only a thin silicon layer remains. Regardless of the method used to produce an SOI substrate, most semiconductor fabrication processes do not encompass the actual production of the SOI wafer. Most semiconductor fabrication processes comprehend the use of a finished SOI substrate. Device fabrication then begins on top of the thin silicon layer.

The transition to SOI substrates has not been completely problem free. Because of their heterogeneous composition, SOI substrates are susceptible to a number of problems not encountered with bulk silicon substrates. One major problem facing SOI substrates, and semiconductor devices utilizing SOI substrates, is mobile ion migration. There are numerous sources (e.g., humans, chemicals) of potentially detrimental mobile charge present in every fabrication process. The semiconductor industry has identified certain ions (e.g., sodium), as particularly detrimental, since semiconductor devices are sensitive to charge. The core functionality of semiconductor devices rests on the ability to control charges, and charge migration, within a device structure. Thus, the presence of random mobile charges within a device structure causes a number of performance and reliability problems.

A mobile charge's mobility differs, depending on the material it travels in. Mobile charges like sodium have a high degree of mobility in oxides, especially those typically found in SOI substrates (e.g., silicon dioxide). SOI technologies are particularly concerning since an exposed insulator layer provides a highly susceptible path for transient mobile charges to migrate towards device structures. Typically, this insulator comprises a buried oxide layer, running contiguously throughout the substrate. The insulator layer may be exposed to mobile charge after a base SOI substrate (or wafer) is produced, and is almost always exposed after individual devices (or die) are cleaved from the wafer. It is therefore important to provide barriers to mobile charge around a silicon chip so that mobile charges do not reach active circuitry and devices.

Semiconductor producers have thus far addressed this problem through the use of a scribe seal. For each individual die on a wafer, a scribe line is drawn—demarcating where the die will actually be cut from the wafer. The scribe seal concept provides a buffer structure disposed around the perimeter of each individual die as close to the scribe line as possible—sealing off the circuitry disposed upon the die within the scribe seal from mobile charge ingress at the cut edge of the die. Within conventional SOI-based semiconductor devices, the scribe seal usually comprises structure formed beneath the surface of the SOI substrate, upon which other structures are formed in the device levels (e.g., using contiguous structures in levels Metal 1, Via 1, Metal 2, etc.). These scribe seal structures typically utilize and rely upon materials that are resistant to, or completely impede, the diffusive migration of mobile charges, such and metals and certain nitrides.

Most conventional scribe seals are formed in a multi-step process. In order to extend the scribe seal below the surface of an SOI substrate, and down through the insulator layer, conventional processes typically rely on an etch-and-fill methodology. Such a process is depicted in FIGS. 1a through 1c. FIG. 1a depicts an SOI substrate 100, comprising a bulk silicon layer 102, an insulator layer 104, and an upper silicon layer 106. A mask layer 108 is selectively deposited upon wafer 100, such that an aperture is formed in the mask layer where the scribe seal is desired. An etching process is then applied to wafer 100, which may comprise a gross etch (i.e., any material) or a multi-step selective etch (e.g., Si selective etch, followed by oxide selective etch, followed by Si selective etch). After the etching processes have formed a sufficient trench 110 in wafer 100, mask 108 is removed from wafer 100, as depicted in FIG. 1b. Trench 110 is then filled with an appropriate material (e.g., metal) to form barrier 112, as depicted in FIG. 1c. Barrier 112 inhibits the diffusive migration of free mobile charges 114 into wafer 100 through insulator layer 104. As a semiconductor device is fabricated on the upper surface 116 of wafer 100, other scribe seal structures can be formed upon and coupled to barrier 112 to fully encapsulate an active semiconductor device region.

Although such conventional approaches are arguably effective at inhibiting the migration of mobile ions, they are also fraught with a number of limitations and problems. Methodologies, such as those described above, require significant additional processing steps during device fabrication. Formation of an adequate barrier for most SOI substrates requires formation and filling of a relatively deep, contiguous trench around the perimeter of the die. This complicates the device fabrication process, and increases device cost and production time. Furthermore, mechanical characteristics of such structures raise a number of reliability issues. These conventional barrier structures are prone to long-term stability and integrity problems—often due to extreme aspect ratios resulting from relatively tall structures of extremely narrow width, and from the excavation and filling of a relatively large trench in the substrate. For example, metal-based scribe seals may tear or peel, leaving a breach in the seal through which mobile charges can migrate and affect device performance. Finally, conventional methods' heavy reliance on metallization as a barrier limits the processes available for, and applications of, mobile charge barriers.

SUMMARY OF THE INVENTION

Therefore, a versatile system for limiting the diffusive ingress of mobile ions into SOI semiconductor structures during fabrication and operation of a semiconductor device is now needed, providing for efficient, reliable, and cost-effective semiconductor device buffering while overcoming the aforementioned limitations of conventional methods.

The present invention recognizes that barriers to mobile charge ingress, particularly scribe seal barriers within an SOI substrate, can be produced more efficiently with existing semiconductor materials and techniques than previous conventional methods have comprehended. The present invention further recognizes that different materials may be utilized to effect not only barriers, but also different buffering schemes such as mobile charge traps and mobile charge repulsion.

The present invention provides a system for producing SOI substrates incorporating various scribe seal buffers. The SOI substrates include a lower bulk silicon layer, an insulator layer disposed upon the lower bulk silicon layer, and an upper silicon layer, disposed upon the insulator layer. A buffer structure is instantiated within the insulator layer proximal to the outer edge of the SOI substrate.

The present invention also provides a system for producing a scribe seal in a semiconductor device. A substrate is provided, to which a mask is applied to form an aperture over the portion of the substrate where a scribe seal is desired. A buffer material is implanted into the substrate through the aperture, and the mask is removed for further processing.

The present invention also provides a system for limiting mobile charge ingress within an SOI substrate. An SOI substrate is provided, to which a mask is applied to form an aperture over a desired portion of the substrate near its outer edge. A buffer material, selected to impede mobile charge ingress, is implanted through the aperture into the substrate's insulator layer. The buffer material is annealed to effect the desired mobile charge limitation.

BRIEF DESCRIPTION OF THE DRAWINGS

For a more complete understanding of the present invention, including its features and advantages, reference is made to the following detailed description, taken in conjunction with the accompanying drawings. Corresponding numerals and symbols in the different figures refer to corresponding parts unless otherwise indicated.

DETAILED DESCRIPTION

The present invention defines a system, comprising various structures and methods, for buffering SOI-based semiconductor device structures from the effects of mobile charge (or ion) migration. The present invention provides a system for implantation of a scribe seal buffer within the insulator layer of an SOI substrate (or wafer). Depending upon the materials selected in accordance with the present invention, the system may be easily adapted and scaled to a number of semiconductor fabrication processes and applications.

It should therefore be understood that the principles disclosed herein may be applied in a wide range of semiconductor processing applications. Specifically, the present invention may be applied to the formation of any number of scribe seal structures, whether disposed within an SOI substrate or within device layers fabricated upon an SOI substrate. For purposes of explanation and illustration, however, the present invention is hereafter described in reference to mobile ion migration through an insulator layer of an SOI substrate.

Figure 1A:
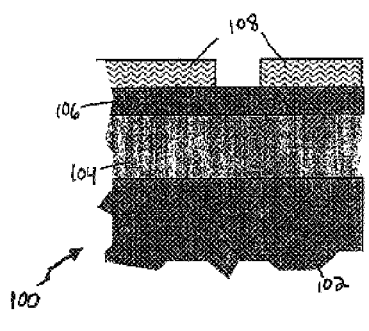
FIGS. 1a–1c show fabrication of a prior art scribe seal barrier.
Figure 1B:
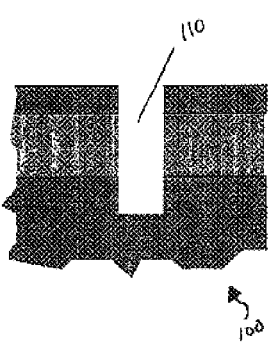
Figure 1C:
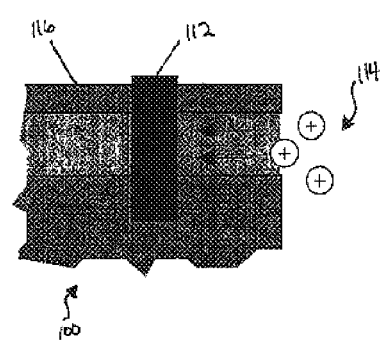
Figures 2A, 2B:
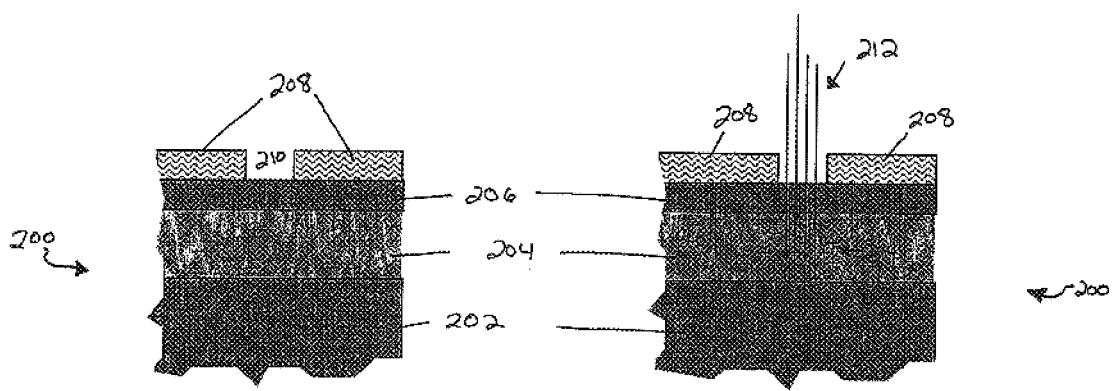
FIGS. 2a–2b illustrate one embodiment of scribe seal formation according to the present invention.

Specific embodiments of the present invention may be implemented utilizing a number of semiconductor processing techniques. One technique that is readily adaptable to the present invention is implantation. Reference is now made to FIGS. 2a–2b, which illustrate implantation of a portion 200 of an SOI substrate according to the present invention. Portion 200 may comprise the outer edge of an entire semiconductor wafer, or just the outer edge of an individual die. Substrate portion 200 comprises a lower bulk silicon layer 202, an insulator layer 204, and an upper silicon layer 206. Insulator layer 204 typically comprises an oxide, such as $SiO_2$. A mask layer 208 may be disposed upon the upper surface of layer 206, such that an aperture 210 is formed above the portion of substrate 200 where a scribe seal buffer is desired. Typically, aperture 210 will be formed close to the outer edge of substrate 200.

An implant 212 of a desired buffer material 214 is targeted through aperture 210. Implant 212 is optimized to instantiate material 214 within layer 204 such that a sufficient mobile charge buffer is formed. For example, a source-drain implant process may be utilized, by increasing delivery energy to a level sufficient to implant a dose of material 214 deep enough within substrate 200 to reach the desired location in layer 204. Mask 208 is then removed, and further processing on substrate 200 may continue. Depending upon the physical nature of material 214, and the desired properties of the resulting buffer structure, an optional anneal may then be performed.

Figure 3:
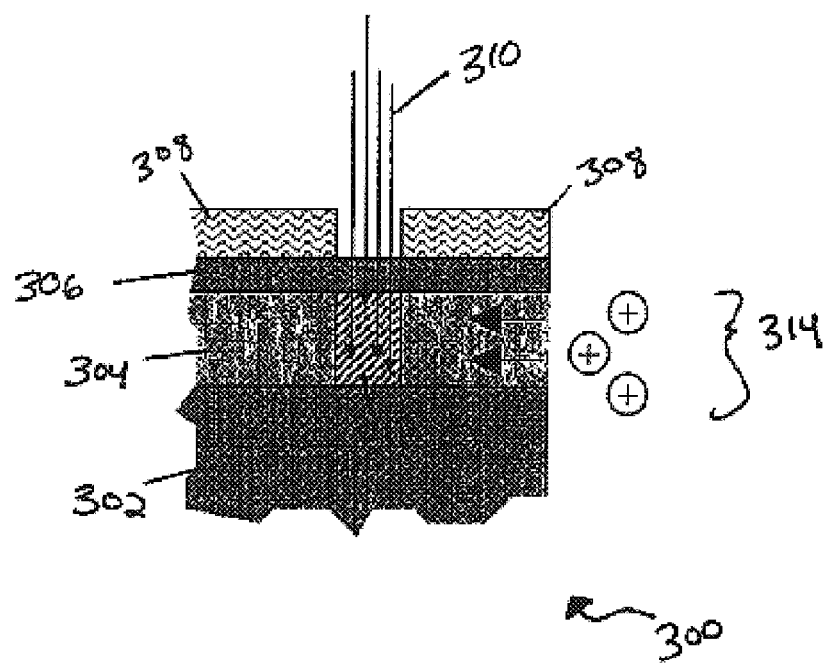
FIG. 3 illustrates one embodiment of a scribe seal according to the present invention.

One embodiment of a buffer structure according to the present invention is now described in reference to FIG. 3. A portion 300 of an SOI substrate according to the present invention is depicted. Portion 300 may comprise the outer edge of an entire semiconductor wafer, or just the outer edge of an individual die. Substrate portion 300 comprises a lower bulk silicon layer 302, an insulator layer 304, and an upper silicon layer 306. Insulator layer 304 may comprise an oxide, such as $SiO_2$.

In this embodiment of the present invention, material is implanted within a desired area of layer 304 so as to form a full scribe seal barrier to mobile charge ingress. A mask layer 308 may be disposed upon the upper surface of layer 306, such that an aperture is formed above the portion of substrate 300 where a scribe seal barrier is desired. Typically, the aperture is formed close to the outer edge of substrate 300.

An implant 310 of a desired barrier material is targeted through the aperture. The implant is optimized to instantiate the desired barrier material within layer 304 sufficient to form barrier 312. The desired barrier material is a material that, either on its own or in combination with the insulator material in layer 304, forms a complete barrier to moving charge 314. For example, a nitrogen implant may be utilized to place nitrogen within layer 304—providing a natural barrier to mobile charge ingress. Nitrogen is readily available in most semiconductor fabrication processes. Mask 308 is then removed for further processing. Depending upon the desired properties of the resulting barrier structure, an anneal may be performed to form the desired nitride oxide complexes within layer 304. Barrier materials, other than nitrogen, that yield similar results may also be utilized.

Figure 4:
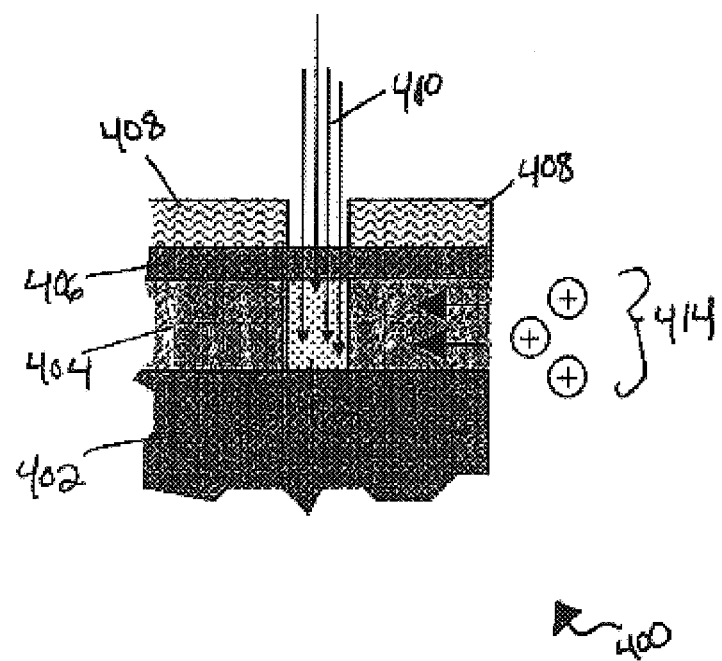
FIG. 4 illustrates another embodiment of a scribe seal according to the present invention.

Another embodiment of a buffer structure according to the present invention is now described in reference to FIG. 4. A portion 400 of an SOI substrate according to the present invention is depicted. Substrate 400 may comprise the outer edge of an entire semiconductor wafer, or just the outer edge of an individual die. Substrate portion 400 comprises a lower bulk silicon layer 402, an insulator layer 404, and an upper silicon layer 406. Insulator layer 404 may comprise an oxide, such as $SiO_2$.

In this embodiment of the present invention, material is implanted within a desired area of layer 404 so as to form a mobile charge trap. Unlike the barrier of the previous embodiment, this embodiment utilizes a scribe seal buffer material that traps mobile charges—preventing further mobile charge ingress. A mask layer 408 may be disposed upon the upper surface of layer 406, such that an aperture is formed above the portion of substrate 400 where a scribe seal buffer is desired. Typically, the aperture is formed close to the outer edge of substrate 400.

An implant 410 of a desired buffer material is targeted through the aperture. The implant is optimized to instantiate the desired buffer material within layer 404 sufficient to form charge trap 412. The desired charge trap material is a material that, either on its own or in combination with the insulator material in layer 404, traps moving charge 414, preventing it from migrating further into layer 404. For example, a phosphorous implant may be implanted within layer 304—providing a charge trap to mobile charge ingress. Phosphorous is readily available in most semiconductor fabrication processes. Other charge trap materials yielding similar results may be utilized.

Figure 5:
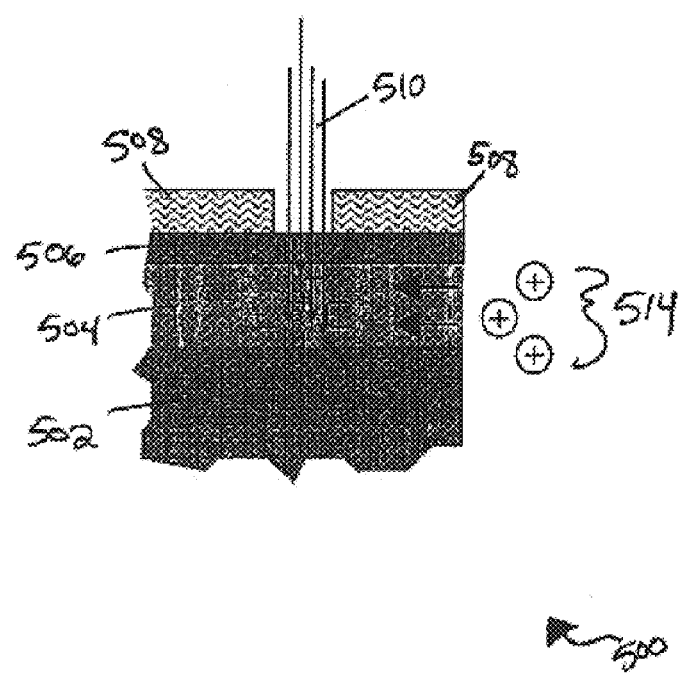
FIG. 5 illustrates another embodiment of a scribe seal according to the present invention.

Another embodiment of a buffer structure according to the present invention is now described in reference to FIG. 5. A portion 500 of an SOI substrate according to the present invention is depicted. Substrate 500 may comprise the outer edge of an entire semiconductor wafer, or just the outer edge of an individual die. Substrate portion 500 comprises a lower bulk silicon layer 502, an insulator layer 504, and an upper silicon layer 506. Insulator layer 504 may comprise an oxide, such as $SiO_2$.

In this embodiment of the present invention, material is implanted within a desired area of layer 504 so as to form a charge repulsion barrier. Unlike the structures of the previous embodiments, this embodiment utilizes a scribe seal buffer material selected to naturally repel migrating mobile charges—preventing further mobile charge ingress. A mask layer 508 may be disposed upon the upper surface of layer 506, such that an aperture is formed above the portion of substrate 500 where a scribe seal buffer is desired. Typically, the aperture is formed close to the outer edge of substrate 500.

An implant 510 of a desired buffer material is targeted through the aperture. The implant is optimized to instantiate the desired buffer material within layer 504 sufficient to form repulsion barrier 512. The desired repulsion barrier material is a material that, either on its own or in combination with the insulator material in layer 504, forms a charge area 512 that repels moving charge 514, preventing it from migrating further into layer 504. For example, a boron implant might be implanted within layer 504 to provide the necessary charge for barrier 512. Other repulsion barrier materials yielding similar results may be utilized.

While this invention has been described with reference to illustrative embodiments, this description is not intended to be construed in a limiting sense. Upon reference to the description, it will be apparent to persons skilled in the art that various modifications and combinations of the illustrative embodiments as well as other embodiments of the invention can be made without departing from the spirit and scope of the invention. For example, the structures and methods of the present invention may be employed in a number of semiconductor fabrication processes. Although described in reference to forming scribe seal structures within a substrate, the teachings of the present invention may also be utilized to form scribe seal structures within device layers atop a substrate. The structures and methods of the present invention may be utilized to reduce the effects of mobile charge migration occurring within a number of device structures and substructures. It is therefore intended that the appended claims encompass any such modifications or embodiments.

What is claimed is:

1. A method of limiting mobile charge ingress within an SOI substrate, comprising the steps of providing an SOI substrate having an outer edge;

applying a mask to the substrate to form apertures over scribe area portions of the substrate, implanting a buffer material, selected to impede mobile charge ingress, through the aperture into the insulator layer within the substrate; end annealing the buffer material; and then scribing said substrate alone said apertures.

2. the method of claim 1 wherein the desired portion of the substrate comprises an area within the insulator layer and proximal to the outer edge.

3. The method of claim 1 wherein the buffer material further comprises a material implanted between the lower bulk silicon layer and the upper silicon layer.

4. The method of claim 3 wherein the buffer material is adapted to block mobile charge ingress.

5. The method of claim 4 wherein the material implanted comprises nitrogen.

6. The method of claim 3 wherein the buffer material is adapted to trap mobile charges.

7. The method of claim 6 wherein the material implanted comprises phosphorous.

8. The method of claim 3 wherein the buffer material is adapted to repel mobile charges.

9. The method of claim 3 further comprising the step of annealing the buffer material after implantation.

10. The method of claim 1 further including the step of then forming devices within said apertures subsequent to said step of annealing.

* * * * *